United States Patent [19]
Khazam et al.

[11] Patent Number: 5,486,753
[45] Date of Patent: Jan. 23, 1996

[54] SIMULTANEOUS CAPACITIVE OPEN-CIRCUIT TESTING

[75] Inventors: Moses Khazam, Lexington; Aldo Mastrocola, Everett, both of Mass.

[73] Assignee: GenRad, Inc., Concord, Mass.

[21] Appl. No.: 302,227

[22] Filed: Sep. 8, 1994

Related U.S. Application Data

[63] Continuation of Ser. No. 100,000, Jul. 30, 1993, abandoned.

[51] Int. Cl.⁶ .................................................. G01R 31/02
[52] U.S. Cl. ........................ 324/72.5; 324/537; 324/522; 324/520
[58] Field of Search .................................... 324/520, 537, 324/522, 72.5, 72, 750, 456, 681, 519, 529, 530, 66

[56] References Cited

U.S. PATENT DOCUMENTS

| | | | |
|---|---|---|---|
| 3,155,898 | 11/1964 | Chope | 324/674 |
| 3,252,087 | 5/1966 | Parke | 324/66 |
| 3,323,049 | 5/1967 | Hanken | 324/683 |
| 4,506,210 | 3/1985 | Chase | 324/66 |
| 4,565,966 | 1/1986 | Burr et al. | 324/158 F |
| 4,857,833 | 8/1989 | Gonzalez et al. | 324/522 |
| 4,862,071 | 8/1989 | Sato et al. | 324/537 |
| 5,254,953 | 10/1993 | Crook et al. | 324/538 |
| 5,266,901 | 11/1993 | Woo | 324/537 |
| 5,268,645 | 12/1993 | Prokoff et al. | 324/537 |

FOREIGN PATENT DOCUMENTS 2143954  2/1985  United Kingdom.

OTHER PUBLICATIONS

Mahoney, *DSP-Based Testing of Analog and Mixed Signal Circuits,* Chapter 5, pp. 61–74 Apr. 1987.

*Primary Examiner*—Maura K. Regan
*Attorney, Agent, or Firm*—Cesari and McKenna

[57] ABSTRACT

To test for proper connections of integrated-circuit connection pins (22) on a circuit board (12) to the conductive paths to which they should be connected, a tester (10) applies signals of different frequencies to paths to be connected to different IC pins provided by the same integrated-circuit package (24). The resultant composite electric-field signal in the vicinity of the integrated-circuit package (24) is coupled to a capacitive probe (42), and the probe signal is subjected to frequency analysis (58-1, 58-2 , ... 58-J) to determine whether the applied frequency components are present in the signal with sufficient magnitudes. If the magnitude in the sensed signal of an applied frequency component is not great enough, the tester generates an indication that the corresponding IC pin has not been properly connected.

2 Claims, 3 Drawing Sheets

SIMULTANEOUS CAPACITIVE OPEN-CIRCUIT TESTING

This is a continuation of application Ser. No. 08/100,000 filed Jul. 30, 1993, now abandoned.

BACKGROUND OF THE INVENTION

The present invention is directed to automatic circuit testing and in particular to capacitive tests for open circuits.

One of the initial steps in testing electronic circuits that comprise a number of integrated circuits mounted on a circuit board is to insure that proper interconnections have been made among the integrated circuits. This includes testing for short circuits between paths on the printed-circuit board and for open circuits between integrated-circuit connection pins and the printed-circuit-board conductive paths to which they are supposed to be soldered or otherwise conductively connected. Open circuits are a particular problem when some of the integrated circuits are surface-mount-type devices, whose connection pins tend to be small and closely spaced. Accordingly, considerable work has been directed to developing tests that detect and identify open circuits.

Certain of the tests employ the digital driver/sensors provided in large numbers on many of the more-elaborate automatic test-equipment systems. Other tests, which can be used not only on elaborate systems but also on less-expensive systems, which do not have as many driver/sensors and sophisticated "back driving" capabilities, are of the capacitive type. In tests of this type, an inexpensively generated analog signal is applied to a circuit path, and a probe having a conductive plate is placed in close proximity to the package of an integrated circuit whose pin should be electrically connected to that printed-circuit path. The proximity of the conductive probe to the package results in capacitance between the probe and certain conductors in the package to which the pin is connected. If the integrated circuit pin is properly connected to the circuit path, the signal applied to the path will appear, by capacitive coupling, on the probe. A judgment as to whether the desired connection exists can therefore be made in accordance with the magnitude of the probe signal that results from the capacitive coupling. (This method can also be used reciprocally, i.e., by using capacitive coupling to apply the signal to the integrated circuit and using conventional conductive probing to sense the resultant signal on the circuit path.)

In the past, this method has presented some probing difficulty, but the type of probe described in the co-pending U.S. patent application of Paul R. Freve for a Probe for Capacitive Open-Circuit Tests, filed on even date herewith and assigned to the assignee hereof, significantly ameliorates the probing problem. However, this leaves another problem, which is the time-consuming nature of the open-circuit testing: before in-circuit or functional tests of the electronic circuit can begin, all or nearly all device pins must be tested for possible open circuits, and the number of such pins on a given board can be quite large.

SUMMARY OF THE INVENTION

The present invention reduces the time required for a capacitive-type open-circuit test to a fraction of what was previously necessary. It does so by enabling pins of the same integrated-circuit device to be tested simultaneously. Specifically, signals of different frequencies are applied to respective signal paths to which different device pins of the same device should be connected, and the resultant signal received by a probe capacitively coupled to conductors inside that integrated-circuit package is a composite of the various frequencies that have been applied through the circuit paths to the device's different pins. This signal is broken into frequency components, and the absence of significant strength in a given frequency component indicates an open circuit between the board path to which a signal of that frequency was applied and the device pin that should have been connected to it.

While different frequencies are applied to the paths associated with different pins on the same device, the same frequencies can be applied to the paths associated with pins on different devices. With a relatively low number of frequencies, therefore, a large fraction—and potentially all—of the device pros on a board can be tested for open circuits simultaneously.

These and further features and advantages of the present invention are described in connection with the accompanying drawing figure, which is a diagrammatic representation of an automatic circuit tester that employs the teachings of the present invention.

BRIEF DESCRIPTION OF THE DRAWINGS

These and further features and advantages of the present invention are described below in connection with the accompanying drawings, in which.

DETAILED DESCRIPTION OF ILLUSTRATIVE EMBODIMENTS

Figure 1A:
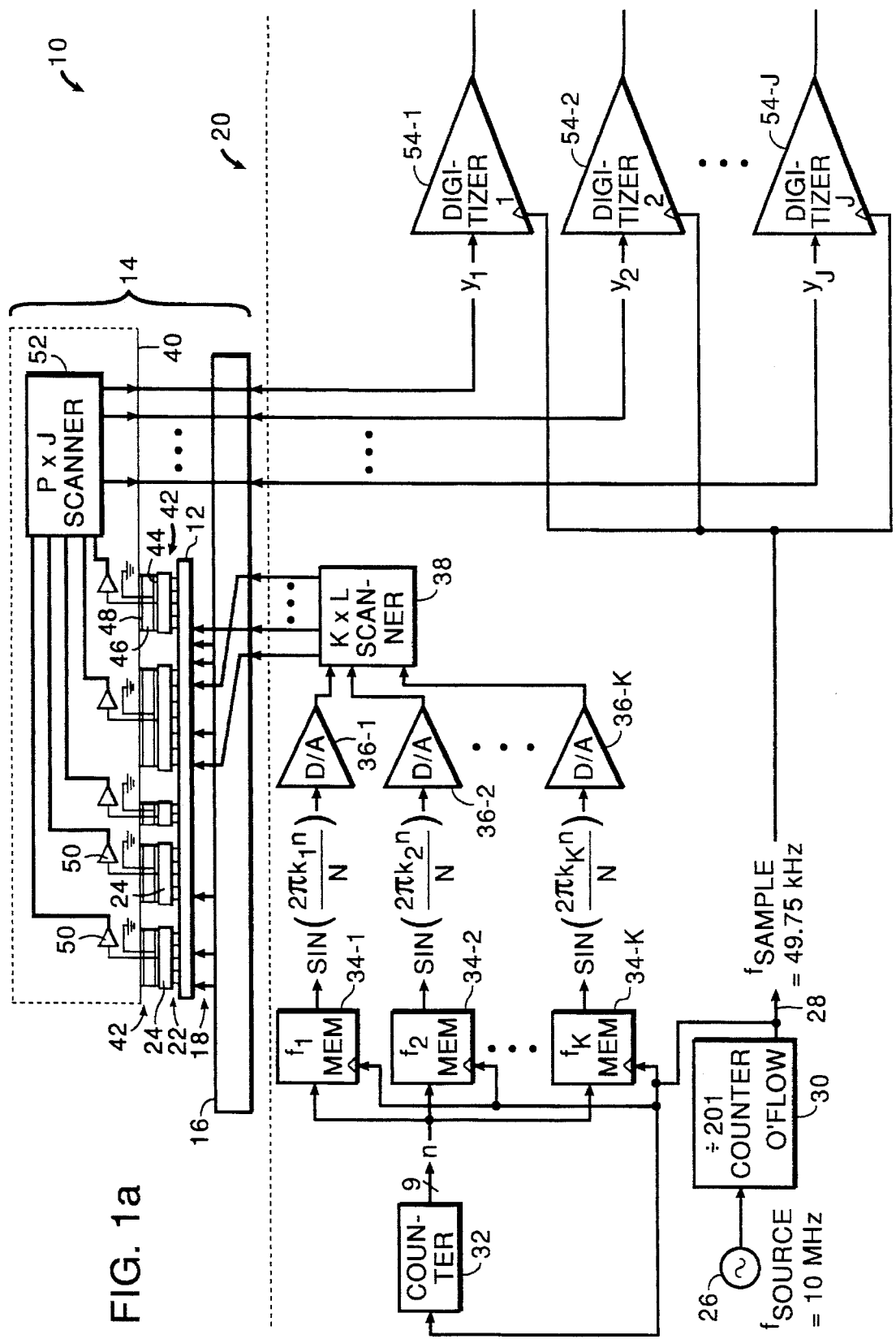
FIGS. 1A and 1B together comprise a diagrammatic representation of a test system that employs the teachings of the present invention.
Figure 1B:
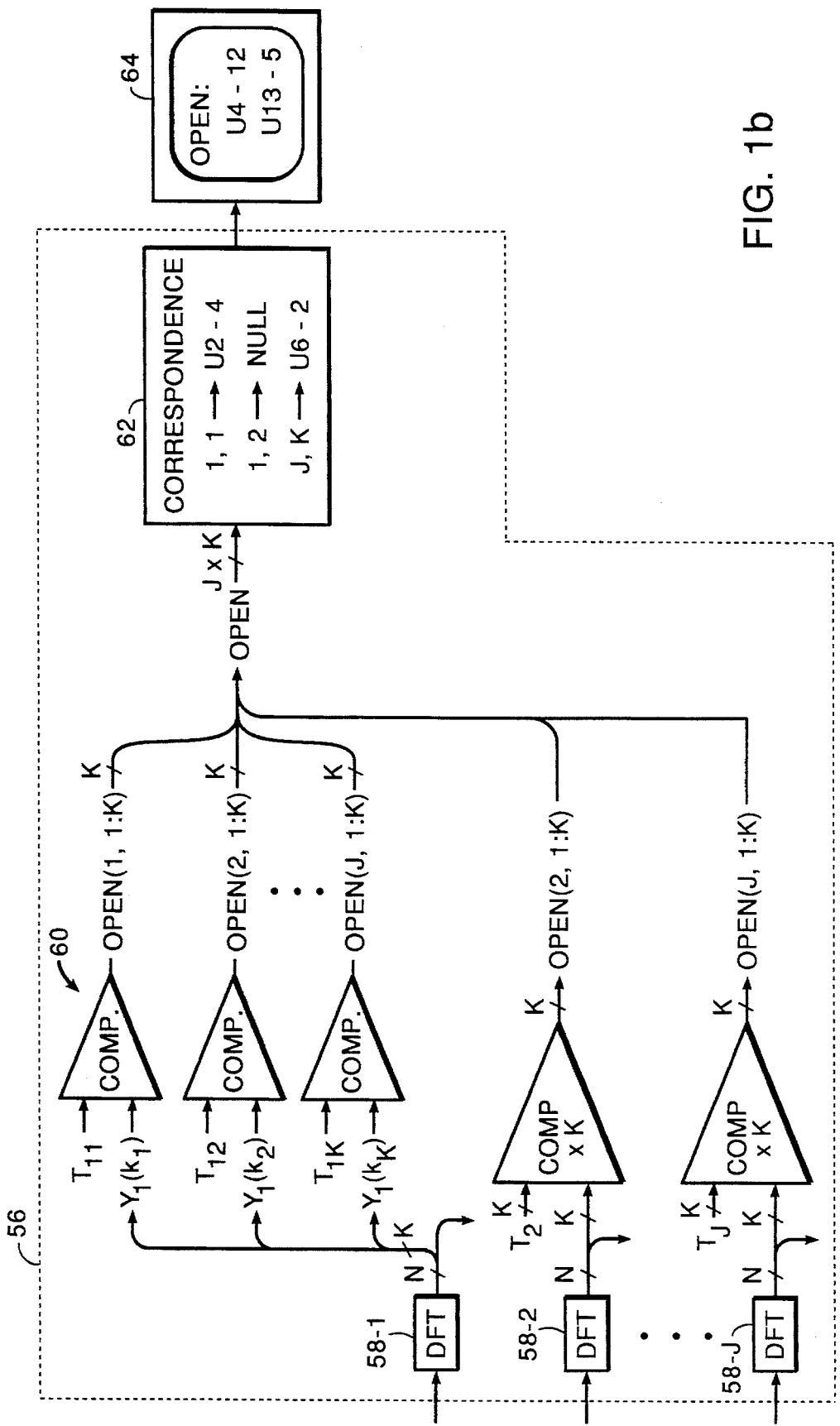

A tester 10 employing the teachings of the present invention is arranged to test a device under test ("DUT") 12 secured in a custom fixture 14. Fixture 14 includes a lower fixture plate 16 of the "bed of nails" type, which includes on its surface a number of probes ("nails") 18 that contact various circuit paths on the DUT so that signals can be applied to them and sensed on them by instruments included in the system hardware 20. Of particular interest to the present invention is the fact that, by using the "nails" 18 to apply signals to contact points on the bottom of the circuit board 12, the tester 10 can place signals on paths to which device pins 22 should be connected if the integrated circuits 24 that provide them have been mounted properly.

In the illustrated embodiment of the invention, generation of these test signals begins with a source oscillator 26, which may, for instance, have a frequency of 10 MHz. The overflow output on line 28 of a counter 30 thereby operating as a frequency divider produces one output pulse for every 201 input pulses and thus produces an output signal having a frequency of 49.75 kHz. A nine-bit counter 32 receives the resultant clock signal and produces a counter output that counts up from zero through 511 approximately once every 10 milliseconds: count cycles occur at a fundamental frequency of 97.17 Hz. This counter output is used as an address input to each of a plurality of memories 34-1 , . . . , 34-K.

Each of these memories has associated with it a different frequency, which is an integer multiple of the fundamental frequency, and the memory contents are values proportional to a sine function having that frequency. For instance, the first memory. 34-1 is associated with a frequency $k_1 f_{fund}$, where $k_1$ is an integer and $f_{fund}$ is the fundamental frequency. The value of its contents in location n is therefore proportional to $\sin(2\pi k_1 n/N)$, where N is the number of steps in a fundamental cycle and in the illustrated embodiment equals 512.

The memories 34 apply the resultant outputs to respective digital-to-analog converters 36-1, 36-2,..., 36-K, whose outputs are thereby sinusoidal signals of different frequencies. A scanner 38 directs the signals to respective ones of the typically large number of contacts on the lower surface of lower fixture plate 16. As is conventional, the lower surface of plate 16 has contacts arranged to register with corresponding contacts on the system hardware, and it provides connections between those contacts and the nails 18, which are disposed in registration with nodes on the DUT 12.

For this open-circuit test, the scanner 38 so routes the different signals that different properly connected device pins 22 on the same device 24 receive different-frequency test signals. As a consequence, a varying electric field in the vicinity of a given device package 24 has significant frequency components at the frequencies applied to its device pins 22. By analyzing the frequency composition of this electric-field signal, therefore, it is possible to determine which pins are properly connected: if the signal does not have enough amplitude at the frequency of the test signal applied to the path to which a given pin is supposed to be connected, it can be concluded that the given pin is not connected properly.

To detect the electric-field signal, the fixture 14 has an upper plate having a lower mounting surface on which a plurality of capacitive probes 42 are mounted in registration with corresponding integrated-circuit packages 24. The probes can be of any type appropriate for capacitive coupling to circuitry within the integrated-circuit packages 24, but the drawings depict them as being of the type described in more detail in the Freve application mentioned above. Each includes a thin plate of printed-circuit-board-type dielectric 44 having conductive surfaces on both sides, thereby forming a capacitor, the upper plate of which is grounded. This upper plate is attached by adhesive to a resilient-foam spacer 46, which in turn is attached by adhesive to a carrier plate 48 suitably secured to the upper fixture mounting surface 40.

Because of capacitance between the lower plate and the device pins, a capacitive voltage divider is formed between the device pins and the upper, ground plate. The divider output at the lower probe plate is conducted to a corresponding high-input-impedance buffer amplifier 50, which buffers the output of the high-output-impedance capacitive voltage divider to produce a signal that is much less susceptible than the unbuffered voltage-divider output to noise corruption.

In one embodiment, the number K of test frequencies is 8. Their harmonic numbers $k_1, k_2, \ldots k_k$ are 61, 63, ..., 77, so the test frequencies are 5927 Hz, 6122 Hz,..., 7482 Hz.

In the illustrated embodiment, there are as many buffers 50 as there are probes 42, although this clearly is not a requirement of the present invention. Also, although all of these signals can be analyzed simultaneously in accordance with the present invention, the illustrated embodiment chooses only a subset for simultaneous processing. Accordingly, the fixture 14 includes a small scanner 52, which selects J of the P buffer signals for analysis. It forwards the selected signals on J lines to J digitizers 54-1, 54-2,..., 54-J in the system hardware 20. Each digitizer includes an anti-aliasing filter having a cut-off frequency of 10 kHz followed by an analog-to-digital converter that samples the filter output at sampling times defined by a sampling signal that for the sake of convenience in the illustrated embodiment is the same as that used to trigger counter 32. Although the same signal does not in principle need to be employed for both purposes, those skilled in the art will recognize that this approach has certain practical advantages in the illustrated embodiment.

The digitizer assembles the resultant digitized samples into 512-sample records, which it presents to a digital signal processor 56 for frequency analysis.

Conceptually, the appropriately programmed digital signal processor can be thought of as providing circuitry for performing J simultaneous discrete Fourier transformations 58-1, 58-2,..., 58-J, although those skilled in the art will recognize that the digital signal processor employs common circuitry for all of the conversions. Since the transformation input is a $2^9$-sample record, it would typically be performed by way of the fast-Fourier-transformation ("FFT") algorithm, although that expedient is not necessary to the practice of the present invention. Indeed, extraction of the various frequency components need not be performed by way of a Fourier transformation at all. However, the discrete-Fourier-transformation approach is convenient because the orthogonality property of that transform eliminates "cross talk" among the various test frequencies if transformation "bin" frequencies are chosen as test frequencies of the memory-34 outputs.

The K chosen outputs of each FFT operation 58 are compared with respective thresholds T in operations that the drawing depicts by comparator blocks 60. The result is potentially J×K OPEN signals, which the system software, represented by correspondence block 62, converts to the names of the corresponding DUT nodes to generate an indication of which nodes are improperly connected. Signals indicative of the improper connections are used to generate a report, as display 64 suggests, or to control further process equipment.

Figure 2:
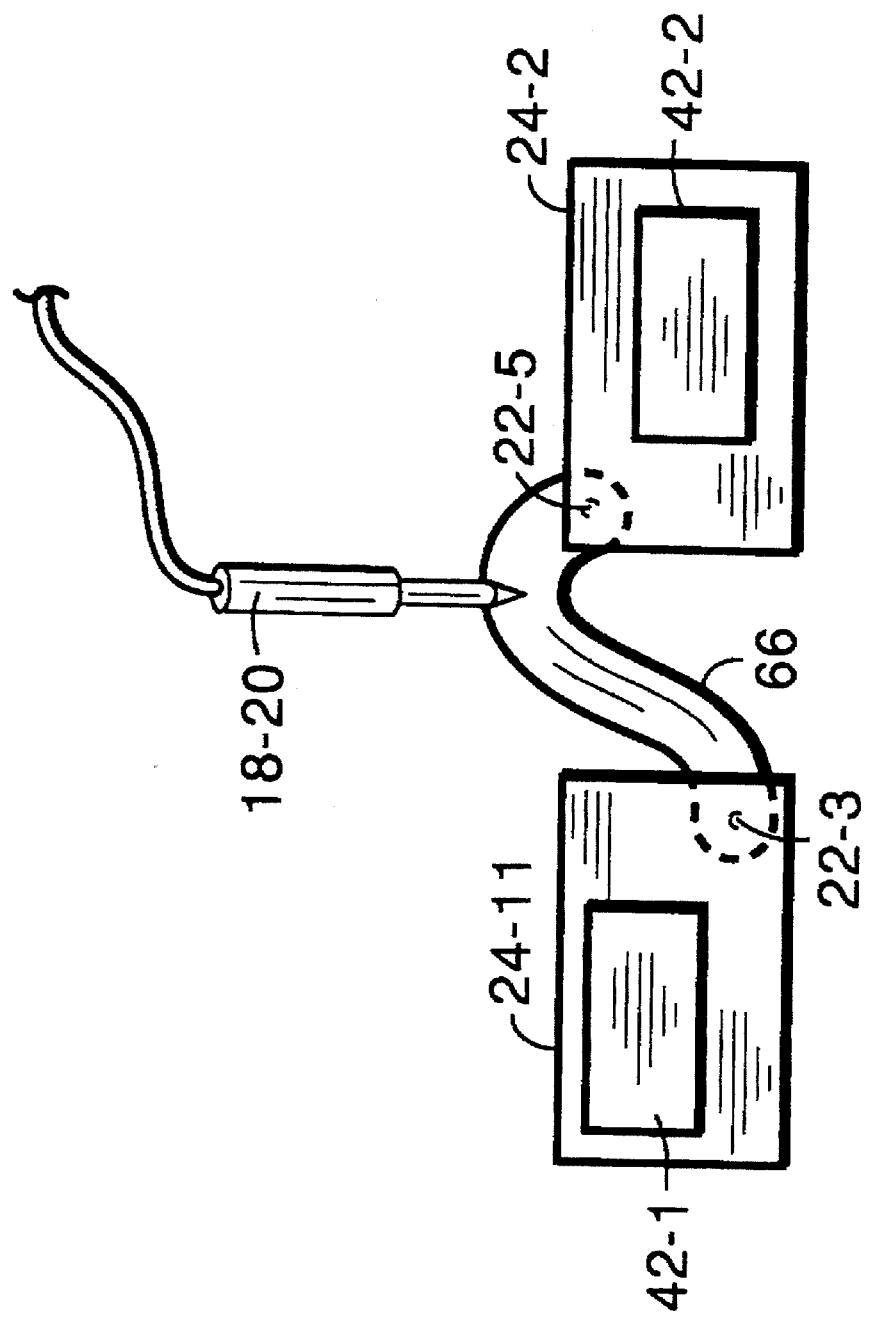
FIG. 2 is a diagram depicting two capacitively driven board devices.

While we prefer to drive the DUT signal paths and capacitively sense the resultant signals from the board devices, the reverse is possible, too: signals can be capacitively driven onto the devices and resultant signals sensed at the circuit paths. In FIG. 2, for example, probes 42-1 and 42-2 can be driven with different frequencies to produce electric-field signals that are thereby capacitively coupled through circuitry in integrated-circuit packages 66-1 and 66-2 to respective (arbitrarily numbered) IC pins 22-3 and 22-5. The board paths to which these pins 22-3 and 22-5 are intended to be connected are themselves conductively connected together; indeed, as illustrated in FIG. 2, they are the same path 66, although they could be connected together by, for instance, system scanner circuitry. In any event, the result is that an (again, arbitrarily numbered) nail 18-20 receives a signal that comprises both frequency components, and this signal can be analyzed for the presence of those signals to determine whether pins 22-3 and 22-5 have been correctly connected.

It is thus apparent that the teachings of the present invention can be practiced in a broad range of embodiments to reduce the time required to test for open circuits. The invention thus constitutes a significant advance in the art.

We claim:

1. For testing, on a circuit board on which is mounted a circuit package that houses an integrated circuit and provides IC pins intended to be conductively connected to conductive paths respectively associated therewith on the circuit board, the continuity between a plurality of the IC pins and the conductive board paths respectively associated therewith, a method comprising the steps of:

A) applying an AC signal of a different test frequency respectively associated therewith to each of a plurality of the board paths associated with the IC pins;

B) capacitively sensing the resultant electric-field signal in the vicinity of the circuit package;

C) determining the contribution of each of the test frequencies to the sensed signal; and D) if the contribution of a given test frequency is less than a predetermined threshold associated therewith, generating an indication of a lack of continuity between the board path associated with the given test frequency and the IC pin associated with that board path.

2. For testing, on a circuit board on which are mounted a plurality of circuit packages, each of which houses an integrated circuit and provides a respective IC pin intended to be conductively connected to a conductive path respectively associated therewith on the circuit board and conductively coupled to the conductive path associated with the IC pin provided by each other circuit package, the continuity between the IC pins and the conductive board paths respectively associated therewith, a method comprising the steps of:

A) generating in the vicinity of each of a plurality of the circuit packages an AC electric-field signal of a different test frequency respectively associated therewith;

B) conductively sensing the resultant signal on the board paths conductively connected together;

C) determining the contribution of each of the test frequencies to the sensed signal; and D) if the contribution of a given test frequency is less than a predetermined threshold associated therewith, generating an indication of a lack of continuity between the board path associated with the given test frequency and the IC pin provided by the circuit package associated with that test frequency.

* * * * *